(12) United States Patent
Kuniyoshi et al.

(10) Patent No.: US 8,492,212 B2
(45) Date of Patent: Jul. 23, 2013

(54) THIN-FILM TRANSISTOR PRODUCING METHOD

(75) Inventors: Tokuaki Kuniyoshi, Osaka (JP); Hidehito Kitakado, Osaka (JP); Tadayoshi Miyamoto, Osaka (JP); Kazuhide Tomiyasu, Osaka (JP); Sumio Katoh, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 13/382,448

(22) PCT Filed: Feb. 17, 2010

(86) PCT No.: PCT/JP2010/052335
§ 371 (c)(1),
(2), (4) Date: Jan. 5, 2012

(87) PCT Pub. No.: WO2011/004624
PCT Pub. Date: Jan. 13, 2011

(65) Prior Publication Data
US 2012/0115286 A1 May 10, 2012

(30) Foreign Application Priority Data
Jul. 9, 2009 (JP) .................................. 2009-162734

(51) Int. Cl.
*H01L 29/66765* (2006.01)

(52) U.S. Cl.
USPC ............................................... 438/160

(58) Field of Classification Search
USPC .................... 438/158, 160; 257/E21.414
See application file for complete search history.

(56) References Cited

U.S. PATENT DOCUMENTS

| 6,246,070 B1 | 6/2001 | Yamazaki et al. |
| 2010/0090208 A1* | 4/2010 | Moon et al. ...................... 257/40 |

FOREIGN PATENT DOCUMENTS

| JP | 06-037111 | * | 2/1994 |
| JP | 6-37111 A | | 2/1994 |
| JP | 9-45930 A | | 2/1997 |
| JP | 10-189991 A | | 7/1998 |
| JP | 2000-150904 A | | 5/2000 |
| JP | 2000150904 | * | 5/2000 |
| JP | 2000-228524 A | | 8/2000 |
| JP | 2009-141145 A | | 6/2009 |

OTHER PUBLICATIONS

Yamazaki et al., "Semiconductor Device Provided With Semiconductor Circuit Consisting of Semiconductor Element and Manufacture Thereof", May 30, 2000, Patent Abstracts of Japan, Publication No. 2000-150904.*

Shimada et al., "Thin Film Transistor and Its Manufacture", Feb. 2, 1994, Patent Abstracts of Japan, Publication No. 06-037111.*

* cited by examiner

*Primary Examiner* — Matthew Reames
*Assistant Examiner* — Nicholas J Choi
(74) *Attorney, Agent, or Firm* — Chen Yoshimura LLP

(57) ABSTRACT

Provided is a thin film transistor manufacture method by which a thin film transistor provided with LDD regions can be produced without increasing the number of photo masks used. An etching stopper layer (35) formed on a polycrystalline silicon film (26) of a TFT (10) is used not only as a mask to protect a channel region (27) when a source electrode and a drain electrode are formed by etching, but also as a mask when ions are implanted to form a source/drain regions (39). Thus, phosphorus, which is ion-implanted in the polycrystalline silicon film (26) to form the source/drain regions (39), is not implanted in the LDD region (38) and, accordingly, it is not necessary to additionally form a resist pattern to be used as a mask when ions are implanted.

7 Claims, 7 Drawing Sheets

THIN-FILM TRANSISTOR PRODUCING METHOD

TECHNICAL FIELD

The present invention relates to a thin film transistor manufacture method, and more particularly, to a thin film transistor producing method in which a thin film transistor is provided with an LDD (Lightly Doped Drain) region.

BACKGROUND ART

Conventionally, a thin film transistor (hereinafter TFT) made of polycrystalline silicon has been in use as a switching element of a pixel part formed in an active matrix type liquid crystal panel. However, the TFT has a significant problem of having a large leak current when it is in an off state. If the leak current of the TFT is large, a signal voltage maintained in a pixel capacitance of each pixel part is reduced and the contrast of an image deteriorates. It is known that such a leak current becomes smaller, if an electric field concentration generated between a drain region and a channel region of the TFT is reduced. Also, there is a situation in which the breakdown voltage between the source region and the drain region needs to be improved. Accordingly, in order to reduce the electric field concentration between the drain region and the channel region and to improve the breakdown voltage between the source region and the drain region, the TFT provided with the LDD region is being produced.

FIGS. 15 to 19 are cross sectional views showing manufacturing steps of a conventional manufacture method of the TFT provided with the LDD region. Referring to FIGS. 15 to 19, the manufacture method of a bottom gate type TFT is described. As shown in FIG. 15, a gate electrode 123 made of a metal film is formed on a glass substrate 120. Next, as shown in FIG. 16, a gate insulating film 124 covering the glass substrate 120 including the gate electrode 123 is formed. Further, an amorphous silicon film is formed on the gate insulating film 124 and is laser annealed to form a polycrystalline silicon film 126. A photo resist is applied to the polycrystalline silicon film 126. By irradiating the photo resist with an exposure light from the back surface side of the glass substrate 20 (bottom side of FIG. 16), a resist pattern 129 is formed on the gate electrode 123 in a self-aligned manner. Next, phosphorus (P), which is an n type impurity, is ion-implanted to the polycrystalline silicon film 126 using the resist pattern 129 as a mask. As a result, a low concentration impurity region 128 with low concentration phosphorus doped and a channel region 127 without phosphorus implanted are formed in the polycrystalline silicon film 126.

As shown in FIG. 17, by further applying a photo resist on an upper surface of the polycrystalline silicon film 126 including the resist pattern 129 and exposing and developing the photo resist using a photo mask, a resist pattern 132 is formed. At this time, this resist pattern 132 is formed so as to cover the resist pattern 129 completely. Next, phosphorus is ion-implanted to the polycrystalline silicon film 126 using the resist pattern 132 as a mask. As a result, in the low concentration impurity region 128 of the polycrystalline silicon film 126, an LDD region 138 is formed adjacent to the channel region 127, and source/drain regions 139 with high concentration phosphorus doped therein is formed outside of the LDD region 138.

As shown in FIG. 18, an insulating film (not shown) is formed on the polycrystalline silicon film 126 and an etching stopper layer 135 is formed by etching the insulating film using the photolithographic method. Next, a metal film 136 is formed so as to cover the glass substrate 120 including the etching stopper layer 135. Further, a resist pattern 137 is formed on the metal film 136.

As shown in FIG. 19, a source electrode 143 and a drain electrode 144 are formed by etching the metal film 136 using the resist pattern 137 as a mask. The polycrystalline silicon film 126 is etched further using the resist pattern 137. As a result, the polycrystalline silicon film 126 is patterned in an island shape and becomes an active layer 141 of the TFT. This way, the TFT having the LDD region 138 is formed.

In Japanese Patent Application Laid-Open Publication No. 2000-228524, there is a description of forming a source region and a drain region of the bottom gate type TFT. These source and drain regions are formed by opening contact holes for connecting to a source electrode and a drain electrode outside of the polycrystalline silicon layer region that becomes an LDD region, and by ion-implantation high concentration phosphorus in these contact holes.

RELATED ART DOCUMENTS

Patent Documents

Patent Document 1: Japanese Patent Application Laid-Open Publication No. 2000-228524

SUMMARY OF THE INVENTION

Problems to be Solved by the Invention

In the manufacture method of the TFT as shown in FIGS. 15 to 19, the following four photo masks are necessary. Specifically, they are a photo mask to form a resist pattern for forming the gate electrode 123, a photo mask to form the resist pattern 132 for doping high concentration phosphorus to the polycrystalline silicon film 126, a photo mask for forming the etching stopper layer 135, and a photo mask to form the resist pattern 137 for forming the source electrode 143 and the drain electrode 144.

However, if the number of photo masks used increases, there is a problem of an increased photo mask producing cost, leading to an increased producing cost of the TFT. Also, every time a step for forming a resist pattern is added, then steps for applying a photo resist through developing the photo resist need to be added. Thus, there is a problem that the producing cost of the TFT increases and the yield of the TFT decreases.

Also, in the manufacture method of a TFT disclosed in Japanese Patent Application Laid-Open Publication No. 2000-228524, a resist pattern is formed using a photo mask in order to form the source region and the drain region in the polycrystalline silicon layer. Opening of the contact holes and ion-implantation are performed using this resist pattern. As described above, because a photo mask needs to be added just to form the source region and the drain region, there is a problem that the manufacturing cost of the TFT increases due to increase in production cost of the photo masks and increase in the number of manufacture steps.

Accordingly, an object of the present invention is to provide a manufacture method of a thin film transistor that can produce the thin film transistor having an LDD region without increasing the number of photo masks used.

Means for Solving the Problems

A first aspect of the present invention is a producing method of a thin film transistor formed on an insulating substrate, the method including:

a gate electrode forming step of forming a gate electrode on a first main surface of the insulating substrate;

a gate insulating film forming step of forming a gate insulating film so as to cover the insulating substrate that includes the gate electrode;

a semiconductor film forming step of forming a semiconductor film on the gate insulating film;

a first resist pattern forming step of forming a first resist pattern on the semiconductor film;

an impurity region forming step of forming an impurity region in the semiconductor film by implanting impurity ions of one of first and second conductive types with a first dose amount to the semiconductor film using the first resist pattern as a mask;

an etching stopper layer forming step of forming an etching stopper layer on the semiconductor film that faces the gate electrode, and a source/drain region forming step of implanting impurity ions of the one of the conductive types to the semiconductor film with a second dose amount that is larger than the first dose amount using the etching stopper layer as a mask to form a source region and a drain region in the semiconductor film with a higher impurity concentration than the impurity region, and to form electric field reduced regions in the impurity region that is sandwiched between the source region and the drain region.

A second aspect of the present invention is the first aspect of the present invention, wherein:

the first resist pattern forming step includes:

an applying step of applying a photo resist, an exposure step of irradiating the photo resist with an exposure light from a second main surface side opposite from the first main surface of the insulating substrate, and a developing step of developing the photo resist to form the first resist pattern in a position facing the gate electrode over the gate insulating film.

A third aspect of the present invention is the first aspect of the present invention, further including:

an electrode forming step, wherein the electrode forming step includes:

a metal film forming step of forming a metal film so as to cover the insulating substrate that includes the semiconductor film and the etching stopper layer;

a second resist pattern forming step of forming a second resist pattern on the metal film;

a metal film etching step of etching the metal film using the second resist pattern as a mask to form a source electrode and a drain electrode; and a semiconductor film etching step of etching the semiconductor film using the second resist pattern and the etching stopper layer as a mask.

A fourth aspect of the present invention is the first aspect of the present invention, wherein:

the semiconductor film forming step includes:

an amorphous semiconductor film forming step of forming an amorphous semiconductor film on the gate insulating film; and an annealing step of making a crystalline silicon film by annealing the amorphous semiconductor film.

A fifth aspect of the present invention is the first aspect of the present invention, wherein:

the semiconductor film forming step includes an amorphous semiconductor film forming step of forming an amorphous semiconductor film on the gate insulating film, and the source/drain region forming step includes an annealing step of making a crystalline silicon film by annealing the amorphous semiconductor film after implanting impurity ions of the one of the conductive types to the amorphous semiconductor film.

A sixth aspect of the present invention is the first aspect of the present invention, wherein:

the etching stopper layer forming step includes:

an oxide film forming step of forming an oxide film on the semiconductor film;

a nitride film forming step of forming a nitride film on the oxide film;

a third resist pattern forming step of forming a third resist pattern on the nitride film; and an etching step of etching the nitride film and the oxide film using the third resist pattern as a mask.

A seventh aspect of the present invention is the first aspect of the present invention, wherein:

the semiconductor film forming step includes an oxide film forming step of forming an oxide film on the semiconductor film, and the etching stopper layer forming step includes:

an oxide film removing step of removing the oxide film on the semiconductor film using the first resist pattern as a mask;

a nitride film forming step of forming a nitride film on the remaining oxide film;

a third resist pattern forming step of forming a third resist pattern on the nitride film; and an etching step of etching the nitride film and the oxide film using the third resist pattern as a mask.

An eighth aspect of the present invention is the first aspect of the present invention, wherein:

the semiconductor film forming step includes an oxide film forming step of forming an oxide film on the semiconductor film, and the impurity ions of the one of the conductive types is implanted through the oxide film in the impurity region forming step.

Effects of the Invention

According to the first aspect of the present invention, the etching stopper layer formed on the semiconductor film is also used as a mask to prevent impurity ions from entering the region that is to become an electric field reduced region during the formation of the source region and the drain region. Accordingly, it is not necessary to form a resist pattern for preventing the impurity ions from entering the impurity region that is to become the electric field reduced region. Consequently, it is not necessary to newly prepare a photo mask for forming such a resist pattern and the number of photo masks used can be reduced. This way, the manufacture cost of photo masks can be reduced and the manufacture steps of a thin film transistor, in turn, can be simplified. Thus, the manufacture cost of the thin film transistor can be reduced. Further, when the manufacture steps of a thin film transistor can be simplified, then the yield of the thin film transistor improves. Thus, the manufacture cost can be further reduced. Also, even though the number of photo masks used is reduced, a thin film transistor having the electric characteristics, such as the breakdown voltage between the source region and the drain region, the threshold voltage, and the like, are maintained as same as those of the conventional art.

According to the second aspect of the present invention, the gate electrode is used as a photo mask and the exposure light is radiated to the photo resist from the second main surface side of the insulating substrate. Thus, the first resist pattern is formed only above the gate electrode. Moreover, the first resist pattern is formed in a self-aligned manner with respect to the gate electrode. Therefore, the photo mask for forming the first resist pattern becomes unnecessary, and the number of photo masks can be reduced by one. Also, in implanting impurity ions to the semiconductor film using the first resist pattern as a mask, an impurity region with a minimal amount of misalignment with respect to the gate electrode can be formed.

According to the third aspect of the present invention, not only the source electrode/drain electrode are formed by etching the metal film using the second resist pattern formed on the metal film as a mask, but also the semiconductor film is patterned using the second resist pattern as a mask. Because of this, it is not necessary to newly form a resist pattern for patterning the semiconductor film, and the number of photo masks can be reduced by one. Thus, the manufacture steps of a thin film transistor can be simplified.

According to the fourth aspect of the present invention, annealing can be performed promptly because after the amorphous semiconductor film is formed on the gate insulating film, the amorphous semiconductor film is annealed to make a crystalline semiconductor film without having other steps in between. Here, the crystalline semiconductor film of the present specification includes not only the polycrystalline semiconductor film, but also a microcrystalline semiconductor film.

According to the fifth aspect of the present invention, after implanting the impurity ions to the amorphous semiconductor film, annealing to make the amorphous semiconductor film a crystalline semiconductor film is performed in the source/drain region forming step. Because of this annealing, not only the amorphous semiconductor film is made into the crystalline semiconductor film, but also activation of the impurity ions implanted during the source/drain region forming step can be performed at the same time. Thus, the manufacture steps of a thin film transistor can be simplified.

According to the sixth aspect of the present invention, a laminated film in which an oxide film and a nitride film are laminated is used for the etching stopper layer. This way, the insulation breakdown voltage between the gate electrode and the source electrode/drain electrode is maintained by making the film thickness of the nitride film somewhat thicker. At the same time, a parasitic capacitance formed between the gate electrode and the source electrode/drain electrode can be reduced by using the oxide film having a smaller relative permittivity than that of the nitride film.

According to the seventh aspect of the present invention, by removing the oxide film on the semiconductor film that is formed by the semiconductor film forming step using the first resist pattern as a mask, only the oxide film on the gate electrode out of the oxide film on the semiconductor film remains. By making this oxide film as the oxide film of the etching stopper layer and by forming the nitride film on the oxide film, the etching stopper layer is formed. Thus, the manufacture steps of a thin film transistor can be simplified.

According to the eighth aspect of the present invention, during the source/drain region forming step, by implanting impurity ions into the semiconductor film through the oxide film formed on the semiconductor film, damages to the semiconductor film can be reduced when compared with the case of implanting impurity ions directly into the semiconductor film.

DETAILED DESCRIPTION OF EMBODIMENTS

A producing method of a TFT 10 according to one embodiment of the present invention is described below.

<1. Configuration of Thin Film Transistor>

Figure 1:
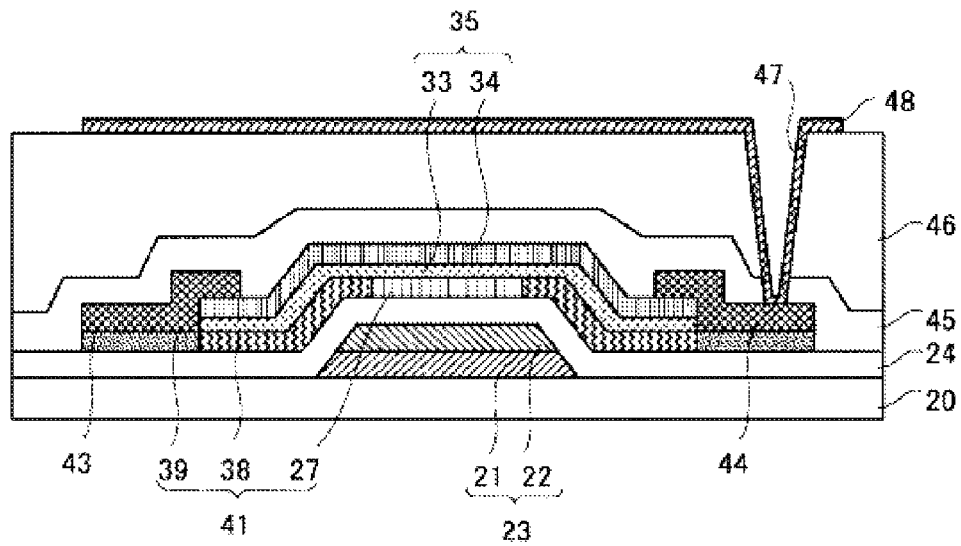
FIG. 1 is a cross sectional view illustrating a configuration of a TFT produced by a manufacture method according to an embodiment of the present invention.

FIG. 1 is a cross sectional view illustrating a configuration of a TFT 10 manufactured by a manufacture method according to an embodiment of the present invention. The TFT 10 in the present embodiment is a bottom gate type and an n channel type TFT. Referring to FIG. 1, the configuration of the TFT 10 is described. A gate electrode 23 is provided on a glass substrate 20, which is an insulating substrate. The gate electrode 23 as shown in FIG. 1 is constituted by a laminated film in which a titanium (Ti) layer 22 is laminated on an upper surface of an aluminum (Al) layer 21. However, the gate electrode 23 is not limited to this. The gate electrode 23 may be constituted by a metal layer such as a tantalum (Ta) layer, a molybdenum (Mo) layer, a tungsten (W) layer, a chromium (Cr) layer, or a copper (Cu) layer, an alloy made of these metals, or a laminated film in which these layers are laminated.

A gate insulating film 24 is formed so as to cover the entire glass substrate 20 including the gate electrode 23. The gate insulating film 24 is a silicon oxide film formed using TEOS (Tetra Ethoxy Ortho Silicate) as a material gas. However, the gate insulating film 24 is not limited to this. The gate insulating film 24 can be a silicon oxide film or silicon nitride film that is formed using other material gases. An active layer 41 made of a polycrystalline silicon is formed on the gate insulating film 24. Further, on an upper surface of the active layer 41, an etching stopper layer 35 in which a silicon oxide layer 33 and a silicon nitride layer 34 are laminated is formed.

In the active layer 41, the region facing the gate electrode 23 is a channel region 27 where phosphorus, which is an n type impurity, is not doped. The regions that are outside of the channel region 27 and that are covered with an etching stopper layer 35 are LDD regions 38 with low concentration phosphorus doped therein. The regions that are further outside of the LDD regions 38 and not covered by the etching stopper layer 35 are source/drain regions 39 with high concentration phosphorus doped therein.

A source electrode 43 is formed so as to cover the entire surface of a source region 39 of the active layer 41 and an end portion of the adjacent etching stopper layer 35. A drain electrode 44 is formed so as to cover the entire surface of a drain region 39 and an end portion of the adjacent etching stopper layer 35. Also, the source electrode 43 and the drain electrode 44 are separated by the etching stopper layer 35 and are electrically isolated.

A passivation film 45 made of a silicon nitride film is formed so as to cover the entire glass substrate 20 including the source electrode 43 and the drain electrode 44. Further, a planarization film 46 made of an acrylic type resin is formed on a surface of the passivation film 45. A pixel electrode 48 made of a transparent metal such as ITO (Indium Tin Oxide) is formed on a surface of the planarization film 46, and the pixel electrode 48 is connected electrically to the drain electrode 44 through a contact hole 47.

<2. Producing Method of Thin Film Transistor>

Figure 2:
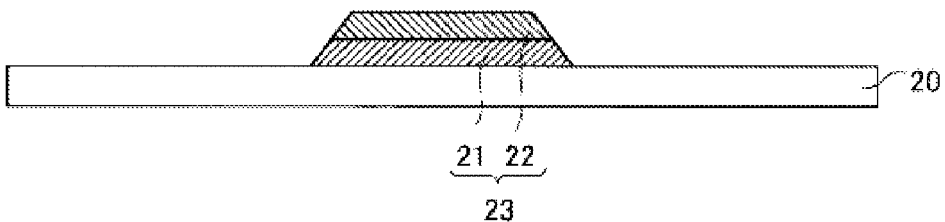
FIG. 2 is a cross sectional view illustrating a manufacture step in a manufacture method of the TFT shown in FIG. 1.

FIGS. 2 to 14 are cross sectional views illustrating producing steps of a manufacture method of the TFT 10 shown in FIG. 1. As shown in FIG. 2, a laminated film in which an aluminum film with a film thickness of 150 nm and a titanium film with a film thickness of 50 nm are lamitated in this order is formed on the glass substrate 20 by the sputtering method. Next, a photo resist is applied to a surface of the titanium film, and a resist pattern (not shown) is formed by exposing and developing the photo resist using a photo mask. Using the resist pattern as a mask, the titanium film and the aluminum film are etched in this order by the dry etching method. This way, the gate electrode 23 in which the titanium layer 22 is laminated on an upper surface of the aluminum layer 21 is formed. Here, if the etching is performed by adding an oxygen gas to an etching gas, then the titanium film and the aluminum film are etched as the end portion of the resist pattern recedes gradually, and as a result, the cross section of the gate electrode 23 becomes tapered shaped.

Figure 3:
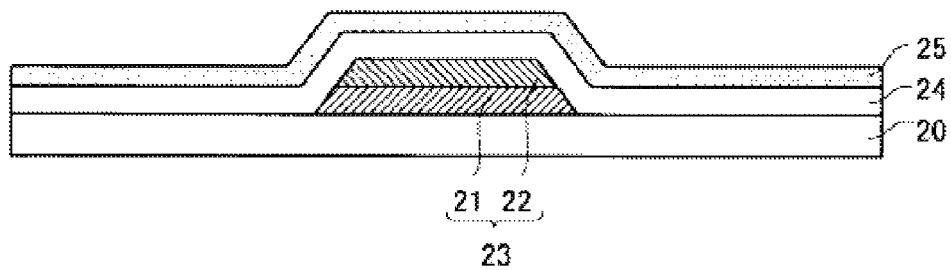
FIG. 3 is a cross sectional view illustrating a manufacture step in the manufacture method of the TFT shown in FIG. 1.

As shown in FIG. 3, the gate insulating film 24 made of an silicon oxide film with a film thickness of 250 nm is formed on the entire glass substrate 20 including the gate electrode 23 by the plasma CVD method. The silicon oxide film that is to become the gate insulating film 24 uses a mixed gas of TEOS and oxygen as a material gas. The silicon oxide film is formed using, for example, plasma that is induced by a high frequency of 20 MHz to 50 MHz with a power density of about 0.5 W/cm², the pressure inside the chamber at about 175 Pa, and the film forming temperature of about 400° C. Here, the gate insulating film 24 may be formed by the plasma CVD method using a mixed gas of silane and nitrous oxide ($N_2O$) instead.

Next, an amorphous silicon film 25 with a film thickness of 50 nm that is not doped with impurities is formed by the plasma CVD method using a mixed gas of silane ($SiH_4$) and hydrogen as a material gas. Here, the gate insulating film 24 and the amorphous silicon film 25 are formed continuously within the same chamber by switching the material gases. By forming the gate insulating film 24 and the amorphous silicon film 25 continuously, formation of an interface state by impurities and foreign objects being attached to their interface can be prevented.

Figure 4:
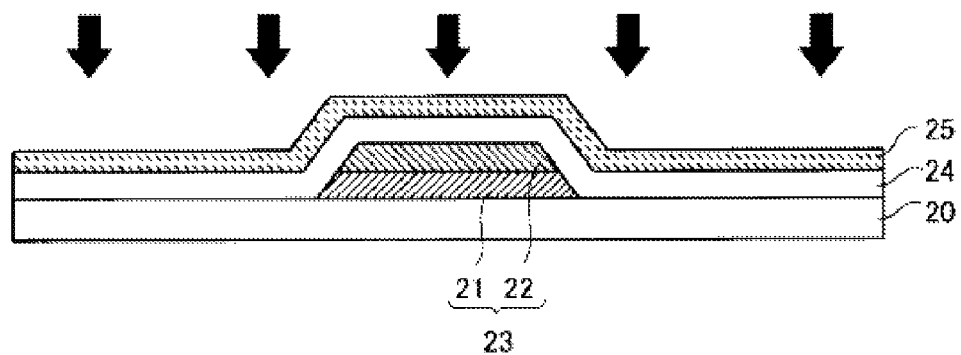
FIG. 4 is a cross sectional view illustrating a manufacture step in the manufacture method of the TFT shown in FIG. 1.

As shown in FIG. 4, about one hour of annealing is performed in a nitrogen atmosphere in order to remove hydrogen inside the film of the amorphous silicon film 25. Next, laser annealing is performed by irradiating the amorphous silicon film 25 with an excimer laser with a wavelength of about 200 nm to 400 nm to make the amorphous silicon film 25 into a polycrystalline silicon film 26. Here, instead of the excimer laser, a solid laser, a flash lamp or the like can be used to perform the annealing. Also, instead of forming the amorphous silicon film 25 and making the polycrystalline silicon film 26, the polycrystalline silicon film 26 may be formed directly on the glass substrate 20.

Figure 5:
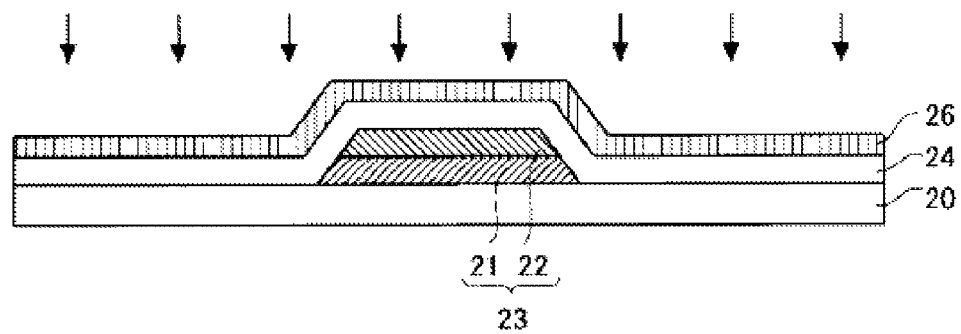
FIG. 5 is a cross sectional view illustrating a manufacture step in the manufacture method of the TFT shown in FIG. 1.

As shown in FIG. 5, boron (B) is implanted into the entire surface of the polycrystalline silicon film 26 in order to adjust the threshold voltage of the TFT 10. The condition of the ion-implantation is, for example, an acceleration energy of 10 keV to 100 keV, and a dose amount of $4 \times 10^{11}$ to $1 \times 10^{13}$ cm$^{-2}$.

Figure 6:
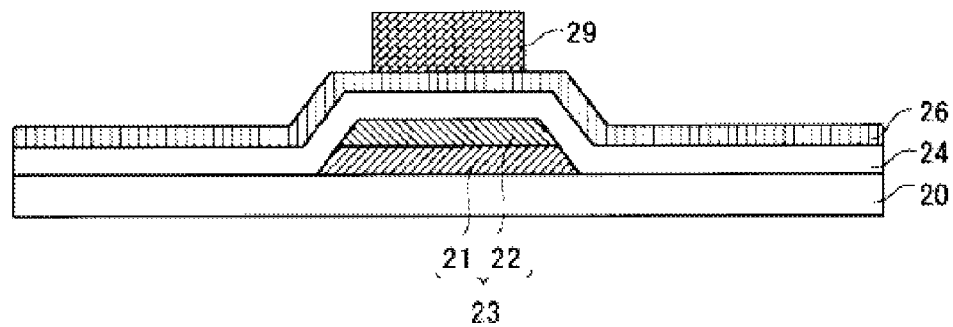
FIG. 6 is a cross sectional view illustrating a manufacture step in the manufacture method of the TFT shown in FIG. 1.

As shown in FIG. 6, a photo resist is applied to a surface of the polycrystalline silicon film 26 and an exposure light is radiated from the back surface side (bottom side of FIG. 6) of the glass substrate 20. In this case, the gate electrode 23 is performing the role of a photo mask, and a resist pattern 29 remains on the gate electrode 23. The resist pattern 29 is formed in a self-aligned manner with respect to the gate electrode 23.

Figure 7:
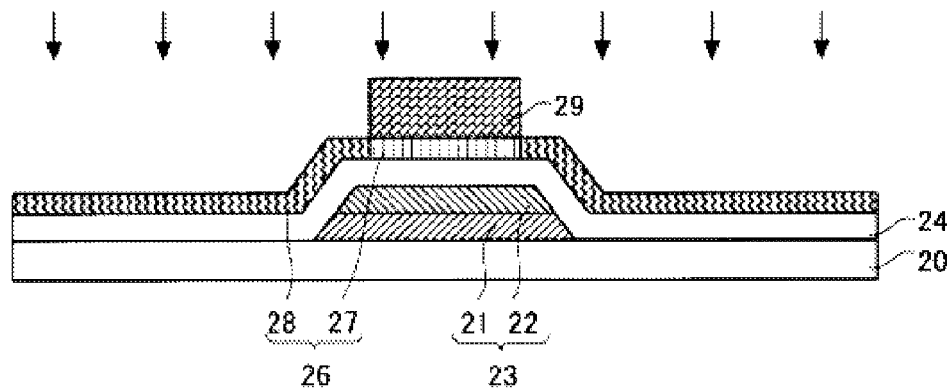
FIG. 7 is a cross sectional view illustrating a manufacture step in the manufacture method of the TFT shown in FIG. 1.

As shown in FIG. 7, phosphorus is ion-implanted using the resist pattern 29 as a mask. The condition of the ion-implantation is, for example, an acceleration energy of 10 keV to 100 kev, and a dose amount of $1 \times 10^{13}$ to $1 \times 10^{14}$ cm$^{-2}$. By this ion-implantation, the region covered by the resist pattern 29 becomes the channel region 27 of the TFT 10, and the regions not covered by the resist pattern 29 become low concentration impurity regions 28 with low concentration phosphorus doped therein. Next, the resist pattern 29 is removed by ashing using oxygen plasma, and annealing is performed to activate boron and phosphorus that were ion-implanted. Annealing is performed by laser anneal, lamp anneal, furnace anneal, or the like.

Figure 8:
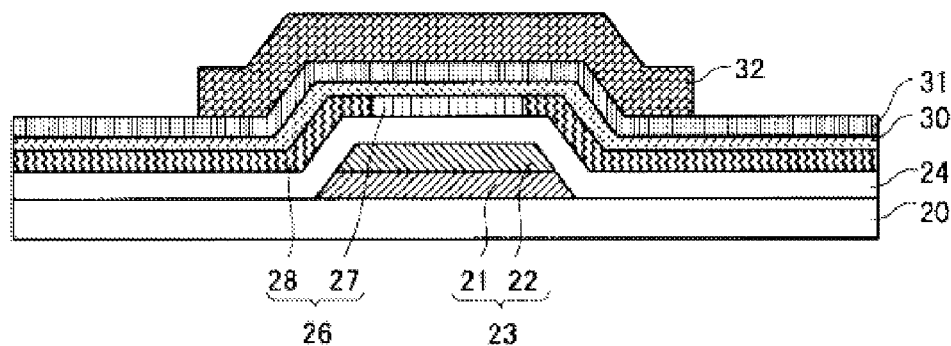
FIG. 8 is a cross sectional view illustrating a manufacture step in the manufacture method of the TFT shown in FIG. 1.

As shown in FIG. 8, a silicon oxide film 30 with a film thickness of 50 nm is formed by the plasma CVD method using TEOS as a material gas. After forming the silicon oxide film 30, by further switching the material gas to a mixed gas of silane, hydrogen and ammonium ($NH_3$), a silicon nitride film 31 with a film thickness of 160 nm is formed continuously. As a result, a laminated insulating film that is to become the etching stopper layer 35 in which the silicon oxide film 30 and the silicon nitride film 31 are laminated is formed. Here, the reason that the laminated insulating film is a laminated film of the silicon oxide film 30 and the silicon nitride film 31 is as follows. The silicon nitride has a larger insulation breakdown voltage compared with the silicon oxide. Further, the relative permittivity of silicon nitride is 7 to 9, which is larger than the relative permittivity of 3.8 to 4.2 for silicon oxide. Therefore, if the etching stopper layer 35 is constituted only by the silicon nitride film 31, then there is a problem that the parasitic capacitance between the gate electrode 23 and the later described source electrode 43/drain electrode 44 becomes large. Accordingly, by making the film thickness of the silicon oxide film 31 somewhat thicker, the insulation breakdown voltage between the gate electrode 23 and the source electrode 43/drain electrode 44 is maintained, and at the same time, by also using the silicon oxide film 30 with a smaller relative permittivity, increase in the parasitic capacitance is suppressed.

Also, the reason that the silicon oxide film 30 and the silicon nitride film 31 are formed on the upper surface of the polycrystalline silicon film 26 in this order is explained. The silicon oxide film 30 has a better adhesion with the polycrystalline silicon film 26 compared with the silicon nitride film 31. Also, the silicon oxide film 30 has a higher interface stability with the polycrystalline silicon film 26. Also, since the etching rate of the silicon oxide film 30 is smaller than that of the silicon nitride film 31, the etching rate becomes smaller once the etching of the silicon nitride film 31 is over and reaches the silicon oxide film 30. Because of this, controlling the etching of the silicon oxide film 30 becomes easier, and over-etching of the polycrystalline silicon film 26 in contact with the lower surface of the silicon oxide film 30 can be prevented.

Here, a single layer insulating film of either the silicon nitride film or the silicon oxide film may be used instead of the laminated insulating film for the etching stopper layer 35. Also, the laminated insulating film may be a laminated film of three or more layers of insulating films instead of the laminated film of two layers of insulating films.

Further, a resist pattern 32 is formed by applying a photo resist to a surface of the silicon nitride film 31 and by exposing and developing the photo resist using a photo mask. Furthermore, the silicon nitride film 31 and the silicon oxide film 30 are etched in this order by the dry etching method using the resist pattern 32 as a mask to form the silicon nitride layer 34 and the silicon oxide layer 33, respectively. As a result, the etching stopper layer 35 constituted by the silicon oxide layer 33 and the silicon nitride layer 34 is formed. The etching stopper layer 35 has the role of protecting the channel region 27 of the polycrystalline silicon film 26 from being etched when etching a later described metal film 36. After forming the etching stopper layer 35, the resist pattern 32 is removed by ashing using oxygen plasma.

Figure 9:
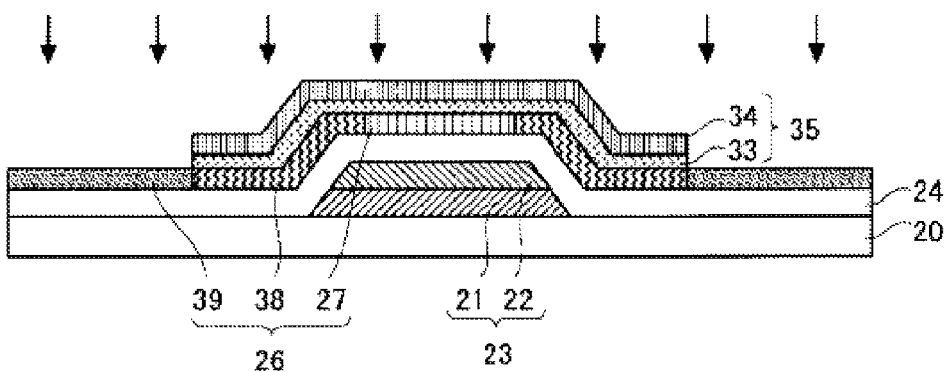
FIG. 9 is a cross sectional view illustrating a manufacture step in the manufacture method of the TFT shown in FIG. 1.

As shown in FIG. 9, phosphorus is ion-implanted to the polycrystalline silicon film 26 using the etching stopper layer 35 as a mask. The condition of the ion-implantation is, for example, an acceleration energy of 10 keV to 100 keV, and a dose amount of $4 \times 10^{14}$ to $1 \times 10^{16}$ cm$^{-2}$. As a result, the LDD regions 38 that are adjacent to the channel region 27 and the source/drain regions 39 that are outside of the LDD regions 38 and that have high concentration phosphorus doped therein are formed in the low concentration impurity regions 28 of the polycrystalline silicon film 26. Here, the ion-implantation of phosphorus may also be performed using the resist pattern 32 and the etching stopper layer 35 as a mask before the resist pattern 32 is removed.

Figure 10:
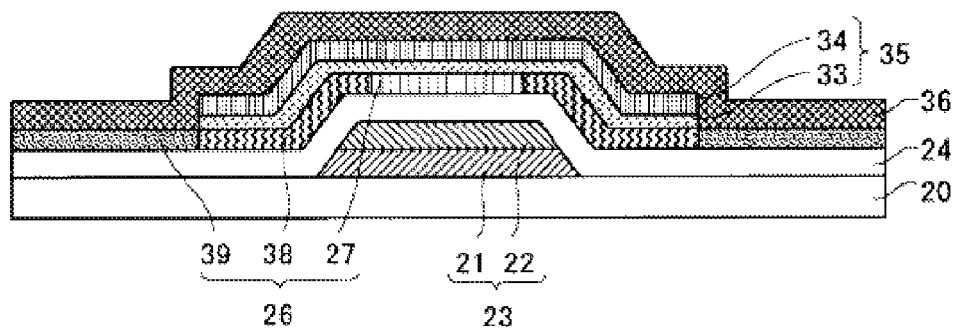
FIG. 10 is a cross sectional view illustrating a manufacture step in the manufacture method of the TFT shown in FIG. 1.

As shown in FIG. 10, the metal film 36 is formed by the sputtering method. The metal film 36 is a laminated metal film in which a titanium film, an aluminum film, and a titanium film (not shown) are laminated in this order, and the film thicknesses of the respective films are 50 nm, 350 nm, and 50 nm. Here, the metal film 36 may also be a single layer metal film such as an aluminum film or a molybdenum (Mo) film.

Figure 11:
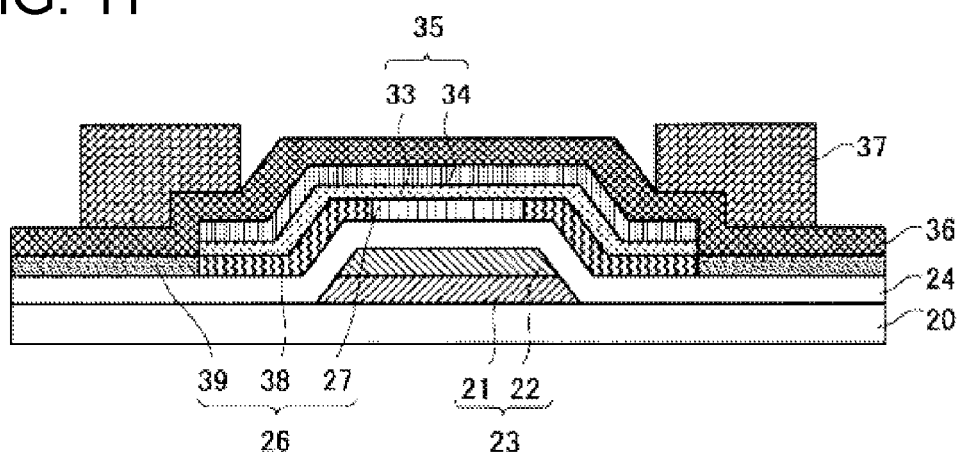
FIG. 11 is a cross sectional view illustrating a manufacture step in the manufacture method of the TFT shown in FIG. 1.

As shown in FIG. 11, by applying a photo resist on a surface of the metal film 36 and by exposing and developing the photo resist using a photo mask, respective resist patterns 37 are formed on the regions where the source electrode 43 and the drain electrode 44 are to be formed. The resist pattern 37 covers the regions that are to become the source region and the drain region in the polycrystalline silicon film 26, and has an opening above the etching stopper layer 35 that faces the gate electrode 23.

Figure 12:
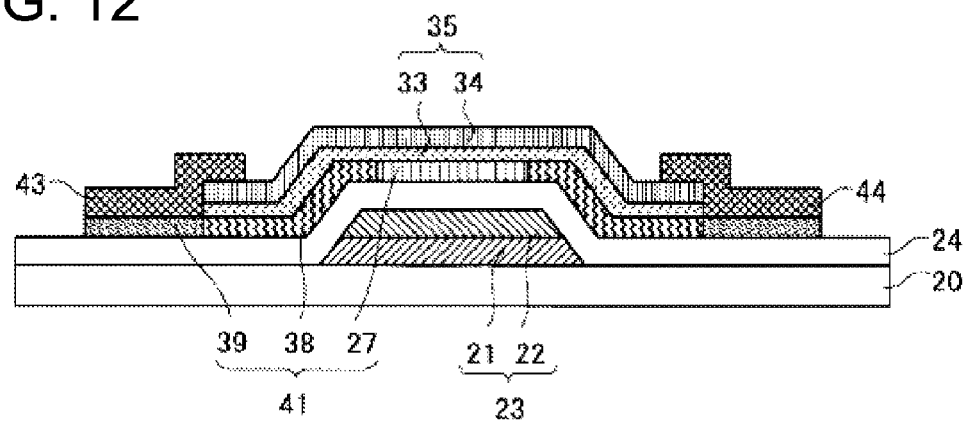
FIG. 12 is a cross sectional view illustrating a manufacture step in the manufacture method of the TFT shown in FIG. 1.

As shown in FIG. 12, by etching the metal film 36 by the dry etching method in the order of the titanium film, the aluminum film, and the titanium film using the resist pattern 37 as a mask, the source electrode 43 and the drain electrode 44 are formed. Further, by etching the polycrystalline silicon film 26 using the resist pattern 37 as a mask, the polycrystalline silicon film 26 becomes an active layer of the TFT 10 and is separated from active layers of other TFTs. Next, the resist pattern 37 is removed by ashing using oxygen plasma.

Figure 13:
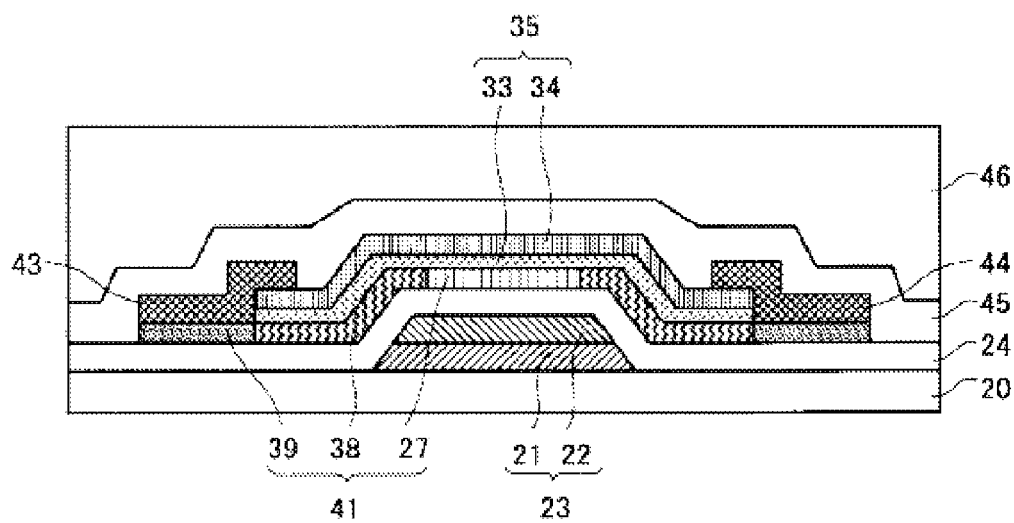
FIG. 13 is a cross sectional view illustrating a manufacture step in the manufacture method of the TFT shown in FIG. 1.
Figure 14:
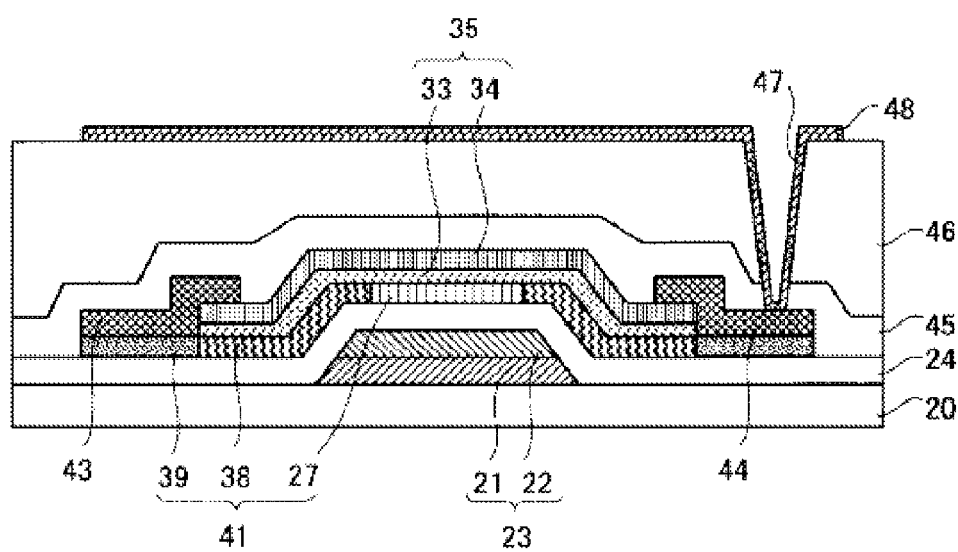
FIG. 14 is a cross sectional view illustrating a manufacture step in the manufacture method of the TFT shown in FIG. 1.
Figure 15:
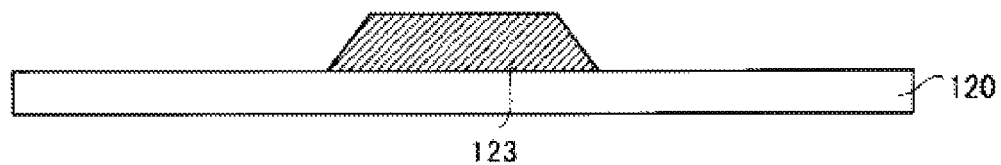
FIG. 15 is a cross sectional view illustrating a manufacture step in a conventional producing method of a TFT provided with an LDD region.
Figure 16:
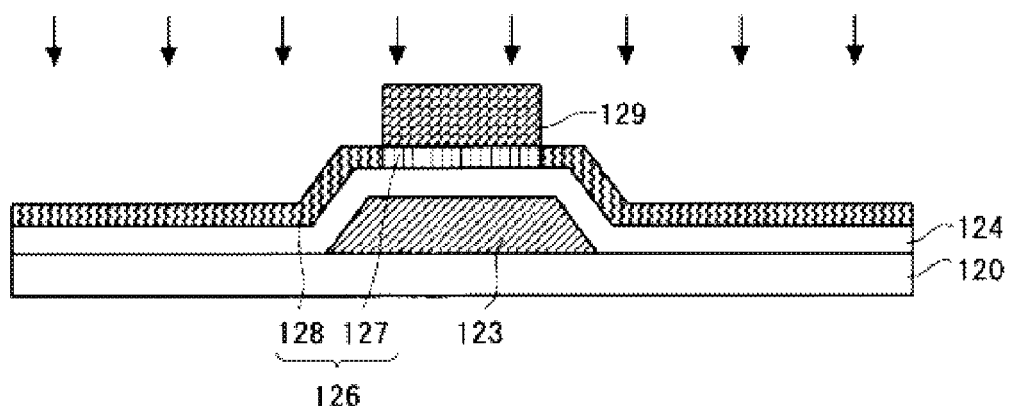
FIG. 16 is a cross sectional view illustrating a manufacture step in the conventional producing method of a TFT provided with an LDD region.
Figure 17:
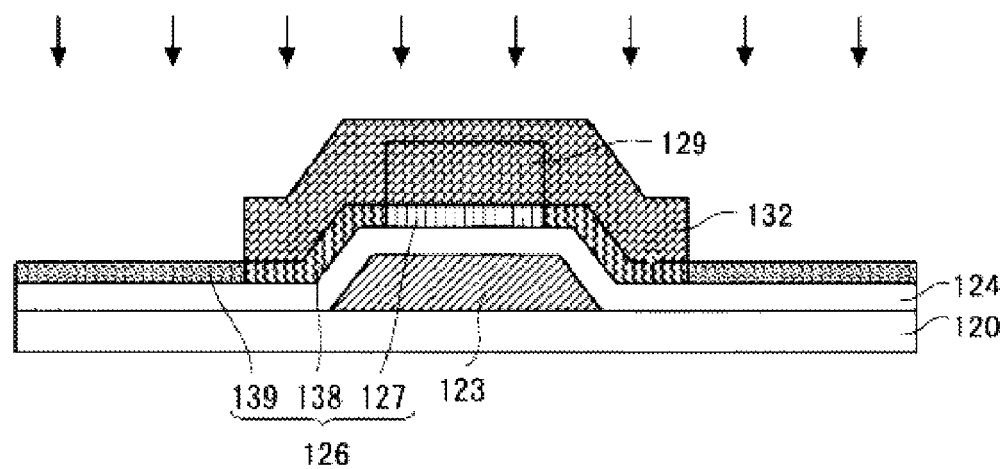
FIG. 17 is a cross sectional view illustrating a manufacture step in the conventional producing method of a TFT provided with an LDD region.
Figure 18:
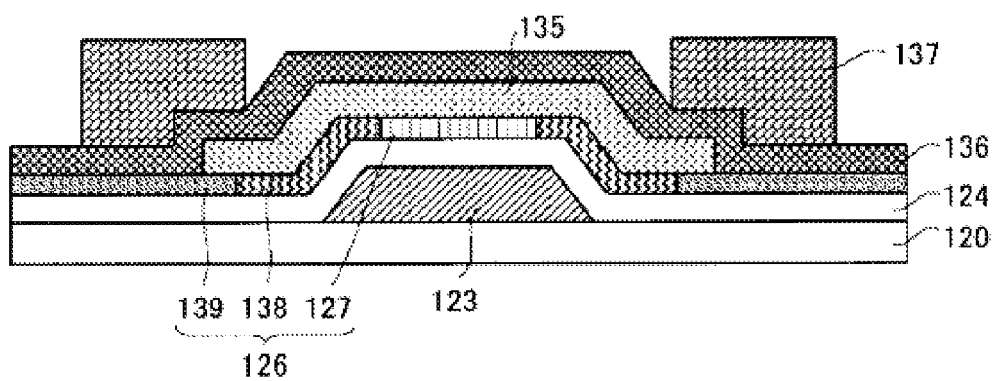
FIG. 18 is a cross sectional view illustrating a manufacture step in the conventional producing method of a TFT provided with an LDD region.
Figure 19:
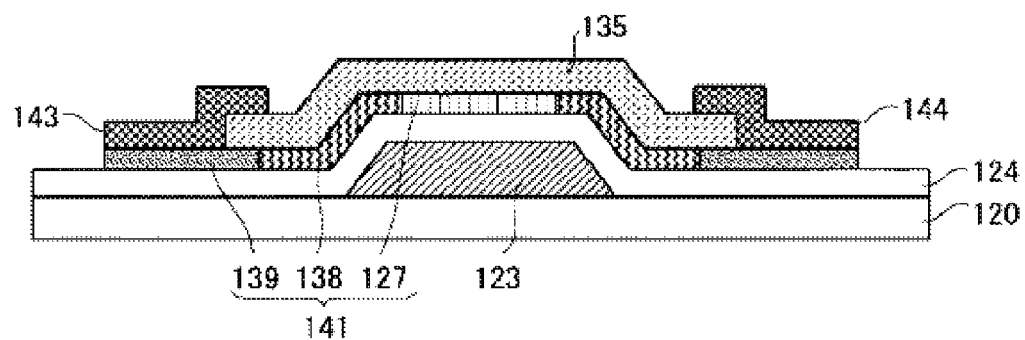
FIG. 19 is a cross sectional view illustrating a manufacture step in the conventional producing method of a TFT provided with an LDD region.

As shown in FIG. 13, a passivation film 45 made of silicon nitride with a film thickness of 200 nm to 400 nm and a planarization film 46 made of an acrylic type resin film with a film thickness of about 1 μm are formed in this order on the entire glass substrate 20 by the plasma CVD method. Next, as shown in FIG. 14, a contact hole 47 that reaches the drain electrode 44 is opened in the planarization film 46 and in the passivation film 45 by the photolithographic method. After opening the contact hole 47, a transparent metal film (not shown) such as ITO or the like is formed by the sputtering method so as to cover the entire glass substrate 20. Then, the pixel electrode 48 is completed by patterning the transparent metal film to a predetermined shape using the photolithographic method. After completing the pixel electrode 48, the entire glass substrate 20 is annealed in a nitrogen atmosphere to complete the TFT 10.

<3. Effects>

In the present embodiment, the etching stopper layer 35 formed on the polycrystalline silicon film 26 of the TFT 10 is used as a mask to protect the channel region 27 when the source electrode 43/drain electrode 44 are formed. In addition, the etching stopper layer 35 is used to mask phosphorus from being ion-implanted to the regions where the LDD regions 38 of the low concentration impurity region 28 are to be formed when phosphorus is ion-implanted to form the source/drain regions 39. Accordingly, it is not necessary to provide a separate step for forming a resist pattern that prevents phosphorus, which needs to be implanted to form the source/drain regions 39, from being ion-implanted to the regions where the LDD regions 38 of the low concentration impurity region 28 are to be formed. Thus, it is not necessary to prepare an additional photo mask for forming such a resist pattern. Because of this, the photo masks needed to manufacture the TFT 10 can be three photo masks in total. They are a photo mask to form the resist pattern for forming the gate electrode 23, a photo mask to form the resist pattern 32 for forming the etching stopper layer 35, and a photo mask to form the resist pattern 37 for forming the source electrode 43 and the drain electrode 44. Compared with conventional manufacture methods, the number of photo masks can be reduced by one. This way, the manufacture cost of photo masks can be reduced. In addition, the manufacture steps of the TFT 10 can be simplified. Thus, the production cost of the TFT 10 can be reduced. Further, when the manufacture steps of the TFT 10, can be simplified, the yield of the TFT 10 improves, and the production cost can be reduced. Also, electric characteristics, such as the breakdown voltage and the threshold voltage between the source region/drain region 39, of the TFT 10 that is manufactured with the reduced number of photo masks remain the same as the electric characteristics of the TFT produced by a conventional manufacture method.

Also, since the exposure light is radiated to the photo resist from the back surface side of the glass substrate 20 using the gate electrode 23 as a mask, the resist pattern 29 is formed only over the gate electrode 23 in a self-aligned manner with respect to the gate electrode 23. Because of this, the photo mask to form the resist pattern 29 is not necessary, and the number of photo masks can be reduced by one. Also, when phosphorus for forming the low concentration impurity regions 28 is ion-implanted to the polycrystalline film 26 using the resist pattern 29 formed as above as a mask, the LDD regions 38 having a minimal misalignment with respect to the gate electrode 23 can be formed.

Also, when the resist pattern 37 is used as a mask in etching the metal film 36 to form the source electrode 43 and the drain electrode 44 as well as in pattering the polycrystalline silicon film 26, it is not necessary to additionally form a resist pattern for patterning the polycrystalline silicon film 26. Therefore, the number of photo masks can be reduced by one and the manufacture process of the TFT 10 can be simplified.

<4. Variation Examples>

The gate electrode 23 and the source electrode 43/drain electrode 44 constitute the parasitic capacitance sandwiching the etching stopper layer 35 as an insulating film. Here, if the parasitic capacitance is made even smaller by increasing the film thicknesses of the silicon oxide layer 33 and the silicon nitride layer 34 that constitute the etching stopper layer 35, then adverse effects such as slowing of the switching operation of the TFT 10 and the like can be suppressed. Here, for example, the film thickness of the silicon oxide film 33 may be increased from 50 nm to about 100 nm, and the film thickness of the silicon nitride film 34 may be increased from 160 nm to about 300 nm.

In the manufacture method of the TFT 10, phosphorus ion-implantation, as shown in FIG. 7 and FIG. 9, is performed while the surface of the polycrystalline silicon film 26 is exposed (bare dope). However, if the silicon oxide film is formed after forming the amorphous silicon film 25, or the silicon oxide film is formed after making the polycrystalline silicon film 26 from the amorphous silicon film 25 by laser annealing, and if phosphorus ion-implantation is performed through the silicon oxide film (through dope), then damages to the polycrystalline silicon film 26 due to the phosphorus ion-implantation are reduced.

The annealing to make the polycrystalline silicon film 26 from the amorphous silicon film 25 may be performed after forming the source/drain regions 39 that are shown in FIG. 9. By performing the annealing after forming the source/drain regions 39, not only the polycrystalline silicon film 26 is made from the amorphous silicon film 25, but also the phosphorus that is ion-implanted to the LDD region 38 and to the source/drain region 39 can be activated. Thus, the manufacture process of the TFT 10 can be simplified.

Instead of the polycrystalline silicon film 26 of the above embodiments, similar effects can be obtained by using a microcrystalline silicon film. Here, the microcrystalline silicon film can be formed directly by a high density plasma apparatus, or the microcrystalline silicon film can be formed by forming an amorphous silicon film using a parallel plates plasma apparatus and by laser annealing the amorphous silicon film.

In the above described embodiments, the manufacture method of an n-channel type TFT 10 was described. However, the manufacture method of the present invention is applicable not only to the n-channel type TFT 10, but also to a p-channel type TFT. Here, when applying to the p-channel type TFT, boron instead of phosphorus should be ion-implanted in order to form LDD regions and source/drain regions.

Also, in the above-described embodiments, the cases of forming one TFT 10 on the glass substrate 20 was described. However, the manufacture method of the present invention is also applicable to the cases of forming a plurality of n-channel type TFTs and/or p-channel type TFTs on the same glass substrate 20.

Also, the TFT 10 manufactured by the above-described method was described as a switching element of a pixel part in a liquid crystal display apparatus. However, the TFT 10 can also be used as a TFT constituting a driver monolithic circuit of a liquid crystal display apparatus, or as a switching element of an organic EL display apparatus.

INDUSTRIAL APPLICABILITY

The present invention is applicable to a matrix type display apparatus such as an active matrix type liquid crystal display apparatus. In particular, the present invention is suitable for a switching element formed in a pixel formation part of such an apparatus.

DESCRIPTION OF REFERENCE CHARACTERS

10: thin film transistor (TFT)
20: glass substrate
23: gate insulating film electrode
24: gate insulating film
25: amorphous silicon film
26: polycrystalline silicon film
27: channel region
28: low concentration impurity region
33: silicon oxide layer
34: silicon nitride layer
35: etching stopper layer
38: LDD region
39: source/drain region
41: active region
43: source electrode
44: drain electrode

The invention claimed is:

1. A manufacture method of a thin film transistor formed on an insulating substrate, comprising:
a gate electrode forming step of forming a gate electrode on a first main surface of the insulating substrate;
a gate insulating film forming step of forming a gate insulating film so as to cover the insulating substrate that includes the gate electrode;
a semiconductor film forming step of forming a semiconductor film on the gate insulating film, wherein the semiconductor film forming step includes an oxide film forming step of forming an oxide film on the semiconductor film;
a first resist pattern forming step of forming a first resist pattern on the oxide film;
an impurity region forming step of forming an impurity region in the semiconductor film by implanting impurity ions of one of first and second conductive types with a first dose amount to the semiconductor film using the first resist pattern as a mask;
an etching stopper layer forming step of forming an etching stopper layer on the semiconductor film that faces the gate electrode, wherein the etching stopper layer forming step includes:
an oxide film removing step of removing the oxide film on the semiconductor film using the first resist pattern as a mask, leaving the oxide film beneath the first resist pattern intact,
a nitride film forming step of, after removing the first resist pattern, forming a nitride film on the remaining oxide film, a second resist pattern forming step of forming a second resist pattern on the nitride film, and an etching step of etching the nitride film using the second resist pattern as a mask; and a source/drain region forming step of implanting impurity ions of the one of the conductive types to the semiconductor film with a second dose amount that is larger than the first dose amount using the etching stopper layer as a mask to form a source region and a drain region in the semiconductor film with higher impurity concentration than the impurity region and to form electric field reduced regions in the impurity region that is sandwiched between the source region and the drain region.

2. The manufacture method of a thin film transistor according to claim 1, wherein the first resist pattern forming step includes:

an applying step of applying a photo resist;

an exposure step of irradiating the photo resist with an exposure light from a second main surface side opposite from the first main surface of the insulating substrate; and a developing step of developing the photo resist to form the first resist pattern in a position facing the gate electrode over the gate insulating film.

3. The manufacture method of a thin film transistor according to claim 1, further comprising an electrode forming step, wherein the electrode forming step includes:

a metal film forming step of forming a metal film so as to cover the insulating substrate that includes the semiconductor film and the etching stopper layer;

a third resist pattern forming step of forming a third resist pattern on the metal film;

a metal film etching step of etching the metal film using the third resist pattern as a mask to form a source electrode and a drain electrode; and a semiconductor film etching step of etching the semiconductor film using the third resist pattern and the etching stopper layer as a mask.

4. The manufacture method of a thin film transistor according to claim 1, wherein the semiconductor film forming step includes:

an amorphous semiconductor film forming step of forming an amorphous semiconductor film on the gate insulating film; and an annealing step of making a crystalline silicon film by annealing the amorphous semiconductor film.

5. The manufacture method of a thin film transistor according to claim 1, wherein the semiconductor film forming step includes an amorphous semiconductor film forming step of forming an amorphous semiconductor film on the gate insulating film, and wherein the source/drain region forming step includes an annealing step of making a crystalline silicon film by annealing the amorphous semiconductor film after implanting impurity ions of the one of the conductive types to the amorphous semiconductor film.

6. The manufacture method of a thin film transistor according to claim 1, wherein the impurity ions of the one of the conductive types are implanted through the oxide film in the impurity region forming step.

7. The manufacture method of a thin film transistor according to claim 1, wherein the impurity ions of the one of the conductive types are implanted through an oxide film on the semiconductor film in the source/drain region forming step.

* * * * *